(12) United States Patent
Wu

(10) Patent No.: US 6,448,816 B1
(45) Date of Patent: Sep. 10, 2002

(54) RESONANT LOGIC AND THE IMPLEMENTATION OF LOW POWER DIGITAL INTEGRATED CIRCUITS

(75) Inventor: Jianbin Wu, Fremont, CA (US)

(73) Assignee: Piconetics, Inc., Fremont, CA (US)

( * ) Notice: Subject to any disclaimer, the term of this patent is extended or adjusted under 35 U.S.C. 154(b) by 0 days.

(21) Appl. No.: 09/614,494

(22) Filed: Jul. 11, 2000

(51) Int. Cl.[7] .............................................. H03K 19/096
(52) U.S. Cl. .............................. 326/98; 326/93; 326/95; 326/97
(58) Field of Search ............................. 326/93, 94, 95, 326/97, 98

(56) References Cited

U.S. PATENT DOCUMENTS

| | | | |
|---|---|---|---|
| 5,559,478 A | | 9/1996 | Athas et al. ................ 331/117 |
| 6,028,454 A | * | 2/2000 | Elmasry et al. ............. 326/115 |
| 6,208,170 B1 | * | 3/2001 | Iwaki et al. ................ 326/121 |
| 6,246,266 B1 | * | 6/2001 | Bosshart ..................... 326/98 |
| 6,255,853 B1 | * | 7/2001 | Houston ...................... 326/98 |

FOREIGN PATENT DOCUMENTS

| | | | | |
|---|---|---|---|---|
| JP | 363093223 A | * | 4/1998 | .................. 326/98 |

OTHER PUBLICATIONS

*Low–Power Digital Systems Based on Adiabatic–Switching Principles*, William C. Athas, Lars "J.L" Svensson, Jeffrey G. Koller, Nestoras Tzartzanis and Eric Ying–Chin Chou, IEEE Transactions on Very Large Scale Integration (VLSI) Systems, vol. 2, No. 4, Dec. 1994.

*Design and Analysis of a Low–Power Energy–Recovery Adder*, Nestoras Tzartzanis and William C. Athas, Institute of Electrical and Electronics Engineers, VLSI, IEEE, Fifth Great Lakes Symposium on SLSI, IEE Press, pp. 66–69, Buffalo, NY, Mar. 16–18, 1995.

* cited by examiner

*Primary Examiner*—Karl D. Frech
*Assistant Examiner*—Steven S. Paik
(74) *Attorney, Agent, or Firm*—Chein-Weu (Chris) Chou; Anthony B. Diepenbrock, III; Oppenheimer Wolff & Donnelly LLP

(57) ABSTRACT

A method and apparatus for operating logic circuitry with recycled energy. An energy storage device such as an inductor collects energy that used to operate logic circuitry during a first phase of a clock cycle and returns the collected energy back to the circuit during a second phase of the clock cycle. An adaptive circuit senses the collected energy that is returned to the logic circuit during the second phase of the clock cycle to determine whether the energy has fallen below a predetermined limit. If so, the adaptive circuit supplies any needed energy during the second phase of the clock cycle. The inductor that collects energy used to operate the logic circuitry and the inherent capacitance of the logic circuitry form a resonant circuit that operates in synchronism with the clock cycle, the inductor storing energy during the first phase and returning the energy to the inherent capacitance of the logic circuitry during the second phase. For complex logic functions, a plurality of blocks of logic circuitry are joined together in a pipeline, so that after a given number of clocks the complex logic function is computed. Pipelining also permits the energy restoring time of each block during the second phase of the clock cycle to be overlapped with the logic computing time at each block during the first phase of the clock, so that no extra clock cycles are required for restoring the energy of each block.

25 Claims, 9 Drawing Sheets

NAND-2 GATE

US 6,448,816 B1

RESONANT LOGIC AND THE IMPLEMENTATION OF LOW POWER DIGITAL INTEGRATED CIRCUITS

CROSS-REFERENCE TO RELATED APPLICATIONS

This Application is related to U.S. application, Ser. No. 09/967,189, entitled "RESONANT LOGIC AND THE IMPLEMENTATION OF LOW POWER DIGITAL INTEGRATED CIRCUITS", filed on Sep. 27, 2001, which is a continuation-in-part of the present application.

BACKGROUND OF THE INVENTION

1. Field of the Invention

The present invention generally relates to reduced power operation of digital circuitry and more specifically to a method and apparatus for operating logic circuitry with alternating power phases.

2. Description of the Related Art

Advances in VLSI fabrication in recent years have greatly increased the levels of integration in digital integrated circuitry with the advent of submicron geometries. However, there has also been an increase in the speed and functionality in such circuitry. One example is the Pentium III microprocessor, which has several million transistors in a 1 cm² area. While these trends are good from the standpoint of delivering increased capabilities to the electronics consumer there has developed a major problem, which is the power consumption of these devices. The Pentium III processor, while having exceptional performance, also has exceptional power dissipation—in the range of about 27 watts for an 866 MHz Pentium III. Adding to the problem, many portable computer systems, such as laptops, personal organizers and cellular telephones, demand the use of the highest performance integrated circuitry but do not have the battery power to run such circuitry for extended periods of time. Battery systems simply have not kept pace with the demands of the technology. To make matters worse, many portable or mobile systems have physical size constraints that preclude the use of extensive cooling devices to remove the power from the integrated circuitry.

Most of the digital integrated circuitry used for today's high performance and high power devices is CMOS circuitry. Power consumption for CMOS circuitry is the sum of static power dissipation and dynamic power dissipation. The former $P_S$ is the result of leakage current while the latter $P_D$ is the sum of transient power consumption $P_T$ and capacitive-load power consumption $P_L$.

Transient power consumption $P_T$, in turn, results from current that travels between the supply and ground (known as through current) when the CMOS device switches and current required to charge internal switching nodes within the device (known as switching current), the charging and discharging of internal nodes being the predominant cause. Capacitive-load power consumption $P_L$ is caused by charging and discharging an external load capacitance.

FIG. 1 shows a typical CMOS inverter circuit 10 which includes a p-channel 14 and an n-channel 16 MOS transistor, the gates of the transistors being connected together and to the inverter input 12, the drains of the transistors being connected together and to the inverter output 18. The source of the p-channel transistor is connected to the voltage supply 22 and the source of the n-channel transistor is connected to ground 24. The output of the inverter is connected to other CMOS circuitry whose loading characteristics are capacitive in nature. This external capacitive loading is modeled by a capacitor 20 connected to the inverter output 18. When the input 12 to the logic circuit is driven low, p-channel transistor 14 turns on, causing the capacitive load 18 with value $C_L$ to be charged from the supply 22 through the p-channel transistor 14 and registering a logic ONE at the output 18. Similarly, when the input 12 is driven high, the p-channel transistor 14 turns off and the n-channel transistor 16 turns on allowing charge stored in the capacitive load 20 to be transferred through the n-channel transistor 16 to ground 24, thus registering a logic ZERO at the output 18. Each cycle of the input signal results in a transfer of charge to and from the capacitive load 20, which is equivalent to an energy transfer of ($\frac{1}{2} C_L \Delta V_c^2$) to charge and ($\frac{1}{2} C_L \Delta V_d^2$) to discharge the capacitive load, where $C_L$ is the value of the capacitive load, $\Delta V_c$ is the change in voltage across the capacitive load when charging the load and $\Delta V_d$ is change in voltage across the capacitive load when discharging the load. This energy $\frac{1}{2} C_L (\Delta V_c^2 + \Delta V_d^2)$ is dissipated as heat. Ultimately, the dynamic energy, on the order of $10^{-12}$ Joules (assuming $C_L$ to be about 1 pf, which includes load and wiring capacitance, and $\Delta V$ to be about a volt), used to operate the circuit of FIG. 1 over a single cycle is lost.

Furthermore, if the cycle of charging and discharging occurs at a frequency f then the power consumed by the circuit of FIG. 1 is approximately $fC(\Delta V)^2$ where equal voltage changes are assumed for charging and discharging. Currently, the frequency of operation of CMOS circuits is as high as $10^9$ Hz. This means that even though the energy consumed over one cycle by a simple CMOS gate is very low, the power consumed when a gate is operated continuously at very high frequencies can be appreciable (on the order of $10^{-3}$ Watts). When there are millions of such gates on a semiconductor die the problem is again multiplied resulting in many tens of Watts being consumed and a large fraction of that power being dissipated as heat.

A common approach to alleviate this problem has been to reduce the supply voltage because the savings in power consumption is proportional to the square of the voltage reduction. However, reduction of the power supply voltage causes other problems which include increasing the susceptibility of the circuit to noise and increased transistor leakage current because the threshold voltage of the MOS transistors must be reduced to permit the devices to operate on the lower supply voltage.

Therefore, there is a need for high-speed, high-functionality integrated circuit devices that have very low power consumption without depending on low supply voltages to achieve the reduction in power consumption.

BRIEF SUMMARY OF THE INVENTION

The present invention is directed towards such a need. An apparatus of the invention includes logic circuitry having an energy storage node, an input clock having a cycle with a first phase and a second phase and an output and at least logic input, where the logic circuitry operates during the first phase of the clock and uses energy from the energy storage node to determine the logic output based on the logic input. An energy storage device is connected to the logic circuitry to capture energy used by the logic circuitry during the first phase and to supply the captured energy to the energy storage node during the second phase. Initialization circuitry is connected to the energy storage node, the energy storage device and to a reset line, and is configured to initially store energy on the energy storage node of the logic circuitry and to discharge the energy storage device in response to an active reset signal on a reset line.

A method in accordance with the present invention includes the steps of storing energy on a node in the logic circuitry and discharging an energy storage device while an initialization signal is active and while the initialization signal is inactive, operating the logic circuitry using the stored energy during a first phase of a clock signal, where the logic circuitry determines a logic output based on at least one logic input. The energy stored during the operation of the logic circuitry is then captured in an energy storage device, typically an inductor, and the captured energy is then returned from the energy storage node to the logic circuitry node during a second phase of the clock signal.

An advantage of the present invention is that higher performance and greater functionality is available for portable devices.

Another advantage is that the need for special cooling equipment is avoided or reduced and yet another advantage is that the battery life of portable equipment is longer.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 2A:
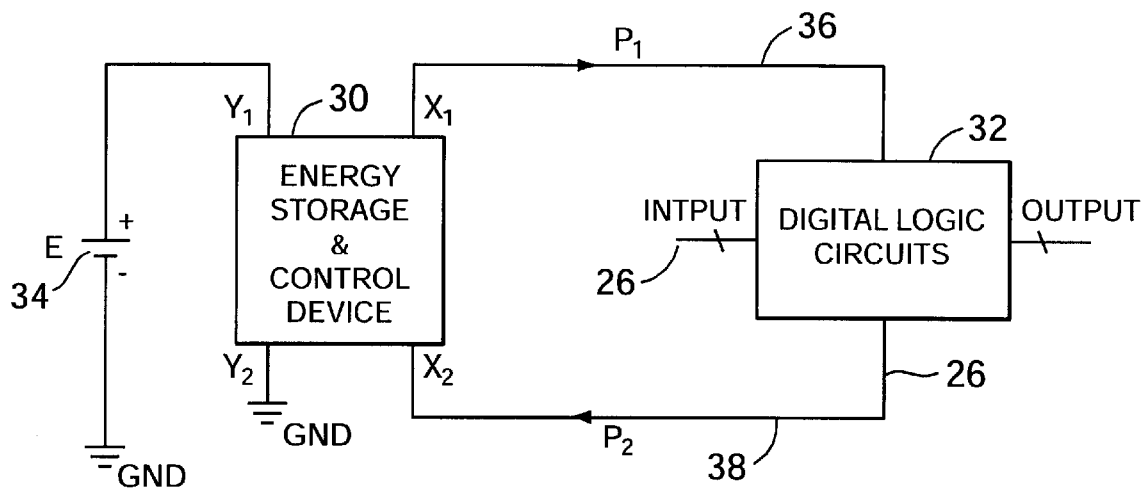
FIG. 2A shows a general block diagram of an apparatus in accordance with the present invention.

FIG. 2A shows a general block diagram of an apparatus in accordance with the present invention. The apparatus of FIG. 2A includes an energy storage and control device 30 and digital logic circuitry 32. The energy storage device 30 is a two-port device, one port Y1-Y2 being connected to a main power source 34 and the other port X1-X2 being connected to the supply 36 and return lines 38 of the digital logic circuitry 32. The energy storage and control device 30 has two important functions. First, the energy storage and control device 30 provides operational energy to and recaptures operational energy from the digital logic circuitry 32. Second, it acts as a conduit to transfer energy from the main power supply Y1-Y2 port to the digital logic circuitry port X1-X2 to make up for the actual energy lost due to heat dissipation in the digital logic circuitry 32. Thus, the total amount of energy dissipated in the system is equal to the energy provided by the main power supply 34. In some embodiments of the present invention, the supply and return lines 36, 38 connected to the digital logic circuitry are a single line.

Figure 2B:
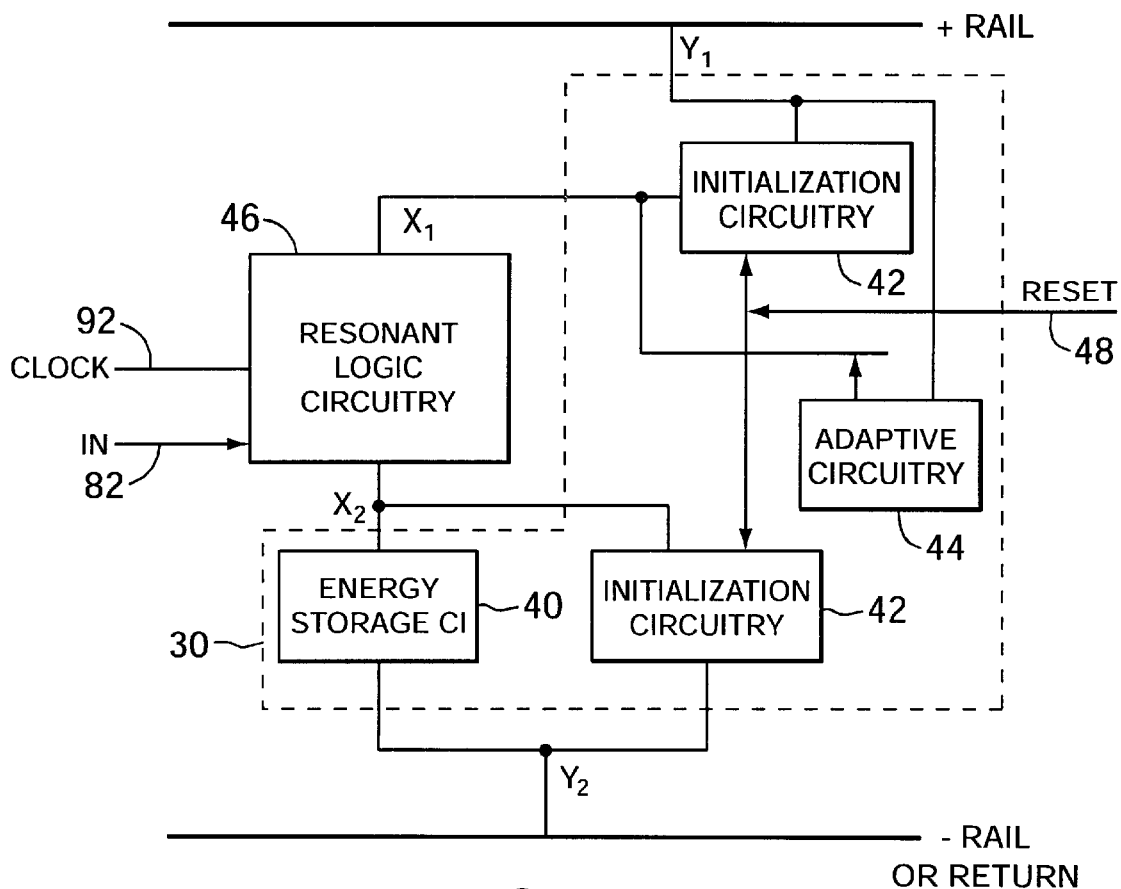
FIG. 2B shows a more detailed block diagram of the apparatus of FIG. 2A.

FIG. 2B shows a more detailed block diagram of the apparatus of FIG. 2A, in which energy storage and control circuitry 30 includes an energy storage device 40, initialization circuitry 42, and adaptive circuitry 44. The digital logic circuitry is implemented by resonant logic circuitry 46. A portion of the initialization circuitry 42 couples power from the main power supply node Y1 to the supply line X1 of the resonant logic circuitry 46 and an energy storage circuit 40 couples the ground line Y2 of the main power supply to the return line X2 of the resonant logic circuitry. Another portion of the initialization circuitry 42 is connected between nodes X2 and Y2, i.e., across the energy storage circuit 40. Both portions of the initialization circuitry 42 connect to a reset input line 48. Adaptive circuitry 44 is connected to the output of the resonant logic circuitry 46 and the supply node Y1 of the main power supply.

In operation, initialization circuitry 42 operates to pre-charge node X1 to the supply voltage at Y1 and pre-discharge node X2 to ground in response to an active signal on the reset line 48. Upon deactivation of the signal on the reset line 48, the resonant circuitry 46 is set into operation and during a first phase it uses energy stored between the X1 and X2 nodes. As the resonant logic circuitry 46 uses energy it sends a portion of that energy to the energy storage circuitry 40 and during a second phase the energy storage circuitry 40 restores that energy across the X1 and X2 nodes (in the form of a voltage). Energy not captured by the energy storage circuitry 40 is dissipated by the resonant logic circuitry 46 and this energy is re-supplied from the main power supply via the adaptive circuitry 44.

Figure 1:
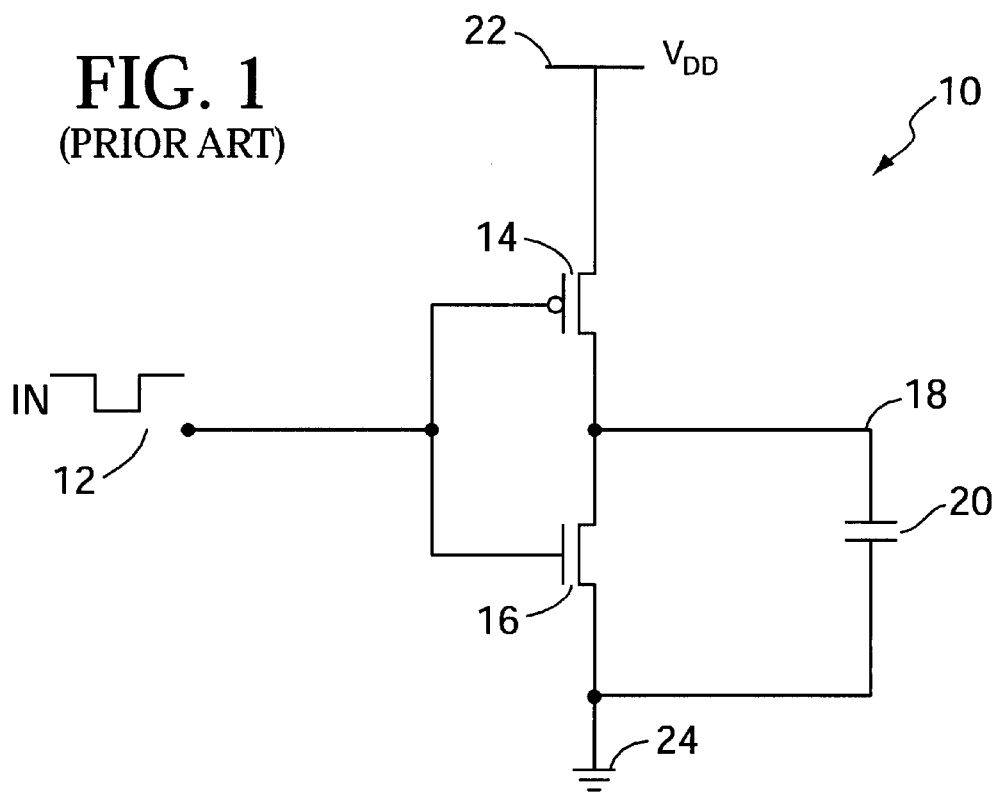
FIG. 1 shows a conventional CMOS inverter circuit.
Figure 3:
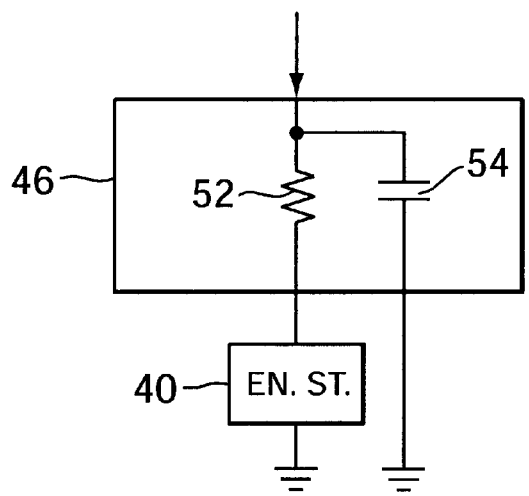
FIG. 3 shows an RC model of resonant logic circuitry in accordance with the present invention.

FIG. 3 shows an equivalent circuit model of resonant logic circuitry 46 in accordance with the present invention. In particular, the resonant logic circuitry 46 is modeled as an RC circuit, where the resistance 52 of the model accounts for the dissipative elements in the logic circuitry and the capacitance 54 of the model accounts for the capacitive nodes of the circuitry in which operational energy is stored. Energy stored in this capacitance 54 is the energy that is used by the logic circuitry and returned to the energy storage circuitry. In the figure, the model of the resonant logic circuitry is shown connected to the energy storage circuitry 40. This combination forms a parallel RLC resonant circuit when the energy storage circuitry is an inductor. An important measure for the energy loss of the resonant circuit is the Q factor, where $Q=\omega_o L/R$, and $\omega_o$ is the radian frequency of oscillation, $\omega_o=1/\sqrt{(LC)} \times \sqrt{(1-CR^2/4L)}$. Highly dissipative resonant circuits reduce the quality factor of the circuit, which means that these circuits convert more of the energy in the circuit to heat and have less energy for transfer between the inductance and capacitance of the circuit. Typical values for the circuit model are R=1 ohm, C=50 pf, and L=10 nH to achieve a resonant frequency of approximately 225 MHz. For the above values the Q factor is approximately 14.

Figure 4:
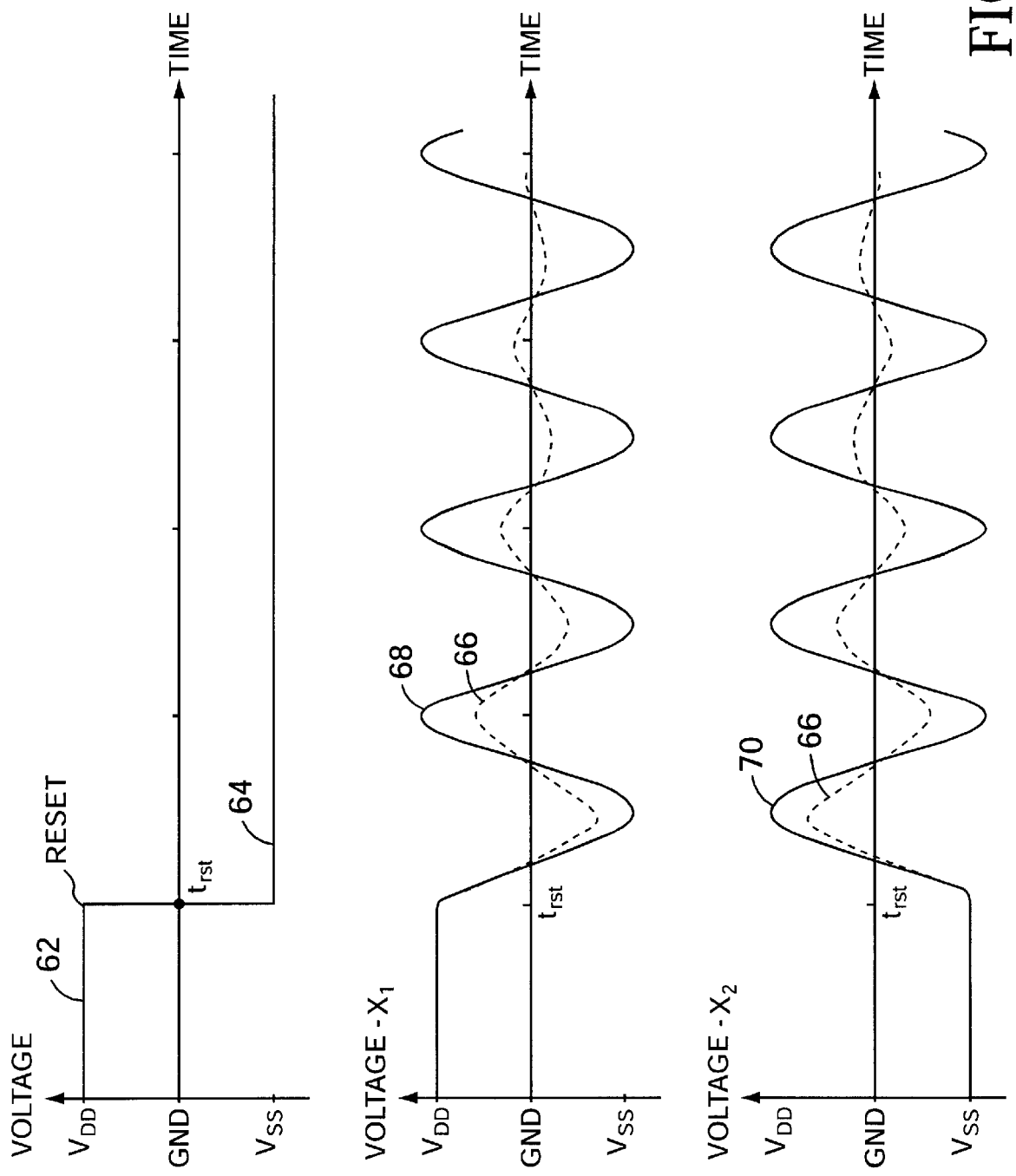
FIG. 4 shows how resonant cycles are started by the initialization circuitry.

FIG. 4 shows how resonant cycles are started by the initialization circuitry. When the reset signal 60 on the reset line 48 (FIG. 2B) is active 62, the voltage at node X1 is forced to be approximately equal to the power supply voltage at the node Y1 and the voltage at the X2 node is forced to be approximately equal to the ground potential at the node Y2. When the reset signal is deactivated 64 at tRST, the voltage across X1 and X2 begins to oscillate at a known frequency, $\omega_o$. Because the RLC resonant circuit is lossy, the oscillations decay 66 over time, where the decay rate is related to the Q factor of the circuit. Note also that FIG. 4 shows the oscillations measured at X1 68 or X2 70 are preferably symmetric about the ground potential to avoid a direct current flowing in the inductor. In other embodiments the oscillations at X1 and X2 are symmetric about a dc voltage.

Figure 5:
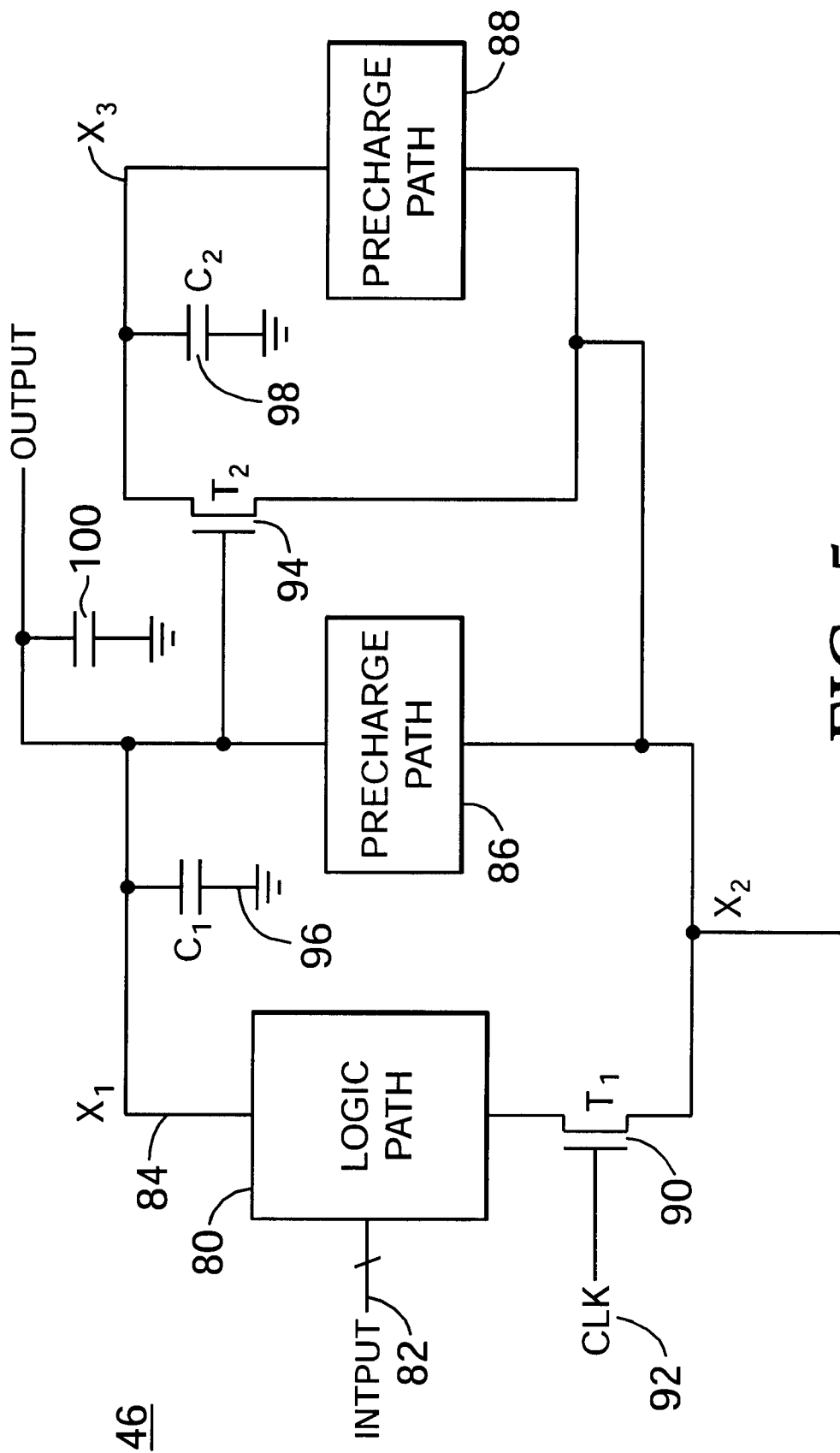
FIG. 5 shows resonant logic circuitry in block diagram form.

FIG. 5 shows resonant logic circuitry 46 in block diagram form. Resonant logic circuitry 46 includes logic path circuitry 80 having a logic input line 82 and an output 84 connected to the X1 node, a first precharge path 86 and a second precharge path 88. The logic path circuitry 80 is connected in series with a MOS transistor 90 and the combination is connected between the X1 and X2 nodes. The gate of the MOS transistor is connected to a clock line 92. The first precharge path 86 is connected between nodes X1 and X2 and is therefore across the series connected logic path 80 and transistor 90. The second precharge path 88 is also connected between nodes X3 and X2, where node X3 acts as a dummy load for the resonant logic circuit. A transistor 94 is also connected between X3 and X2 and is configured to invert the output of the X1 node so that node X1 and node X3 have complementary logic levels when the first precharge path 86 and second precharge path 88 are not active. Parasitic capacitances C1 96 and C2 98 are shown connected to the X1 and X3 nodes and an external load capacitance 100 is shown at the X1 node, the output node, as well.

Figure 6:
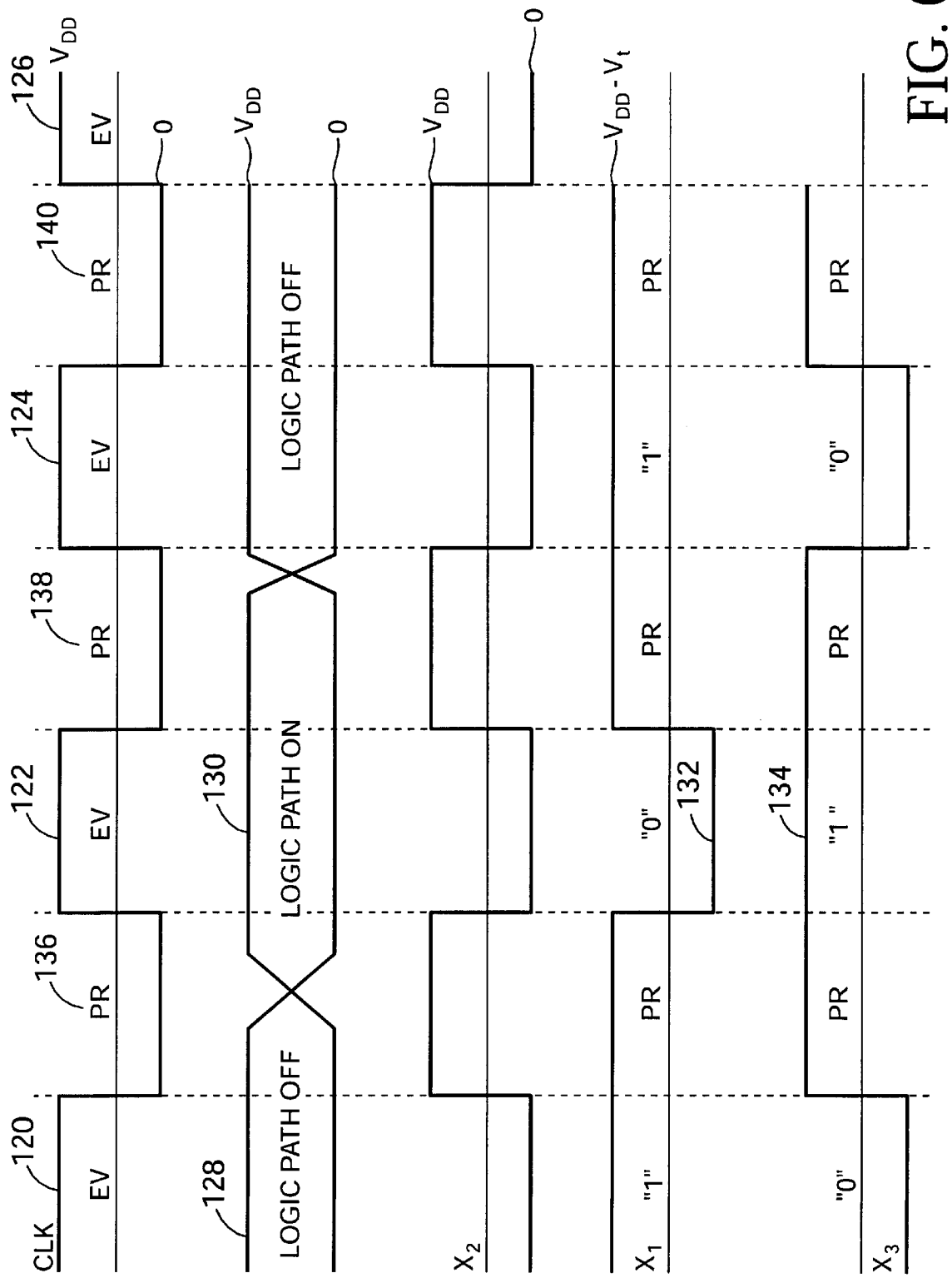
FIG. 6 shows a timing diagram for resonant logic circuitry.

Referring to FIG. 6, and assuming that nodes X1 and X3 are initially precharged to a positive voltage approximately equal to the main power supply voltage (typically Vdd−Vt, where Vdd is the main power supply voltage and Vt is a MOS transistor threshold voltage) and node X2 is initially pre-discharged to ground, two phases of a cycle are identifiable. During a first phase of the cycle 120, 122, 124, 126, i.e., the evaluation stage, the clock signal on the clock line is high (active, VDD), node X1 is more positive than X2, and the logic path circuitry is enabled to operate. If the logic path circuitry is not conducting 128, because of the state of the signal on the logic input, then node X1 stays precharged, and the transistor inverts the high output of the X1 node to create the signal on node X3. This causes the X3 node to be discharged through the transistor to the X2 node. If the logic path circuitry is conducting 130 during the evaluation phase, then node X1 is discharged through the clock transistor to the X2 node and the X3 node stays precharged. There is now a "0" on the X1 node 132 and a "1" on the X3 node 134. The capacitive load on the X1 node and the X3 node is made approximately equal so that, regardless of whether or not the logic path circuitry conducts, approximately the same energy is stored in the energy storage circuitry during the first phase of the cycle.

During the second phase of the cycle 136, 138, 140, the precharge stage, the clock is low, node X2 is more positive than either node X1 or node X3, and the energy stored in the energy storage circuitry is returned via either the first precharge path or the second precharge path to whichever node X1 or X3 was discharged during the evaluation stage. In this way, operational energy that was not dissipated in the evaluation stage is returned during the precharge stage to be reused. Note that the clock signal operates synchronously in frequency and phase to the resonant frequency and phase of the RLC circuit. It is important that there be a close match between the frequency and phase of the clock signal and the resonant frequency of the circuit so that the resonant logic circuitry has at least half of the resonant frequency cycle in which to operate. In a version of the present invention, a PLL or equivalent circuit is employed to maintain a close match between the phase and frequency of the clock and the resonant circuit.

Figure 7A:
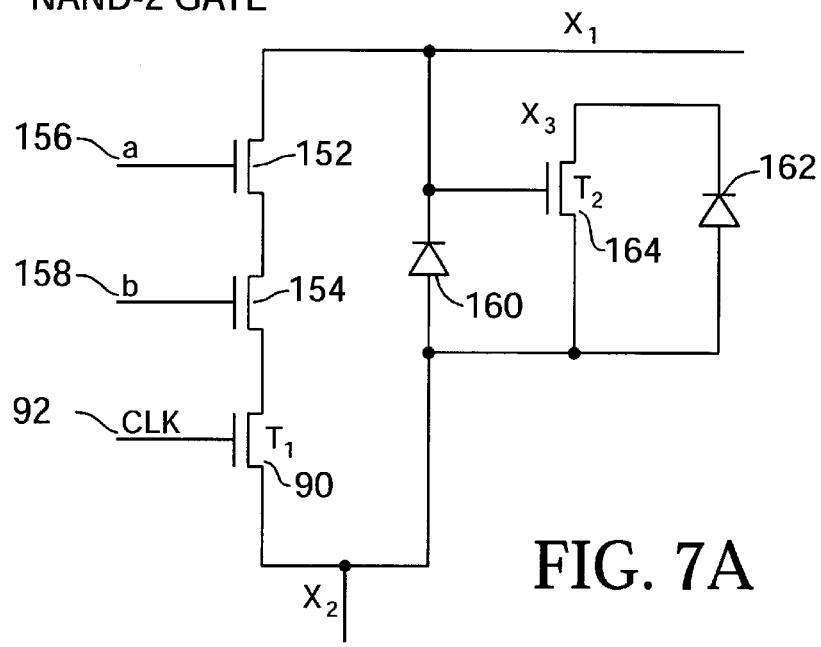
FIGS. 7A and 7C show a resonant NAND gate and a resonant OR gate, respectively, in accordance with the present invention.

FIG. 7A shows a resonant NAND gate in accordance with the present invention. In particular, the logic path circuitry 80 of FIG. 5 is configured to form a two-input NAND logic circuit by connecting two MOS transistors 152, 154 in series. The gate 156 of the first MOS transistor 152 is connected to one of the NAND gate inputs, "a", and the gate 158 of the second MOS transistor 154 is connected to the other NAND gate input "b". The first precharge path 160 and second precharge path 162 are both implemented with semiconductor diodes (or a diode connected transistor or equivalent) each with their respective anodes connected to the X2 node. The cathode of the first precharge path diode 160 is connected to the X1 node and the cathode of the second precharge path diode 162 is connected to the X3 node.

Figure 7B:
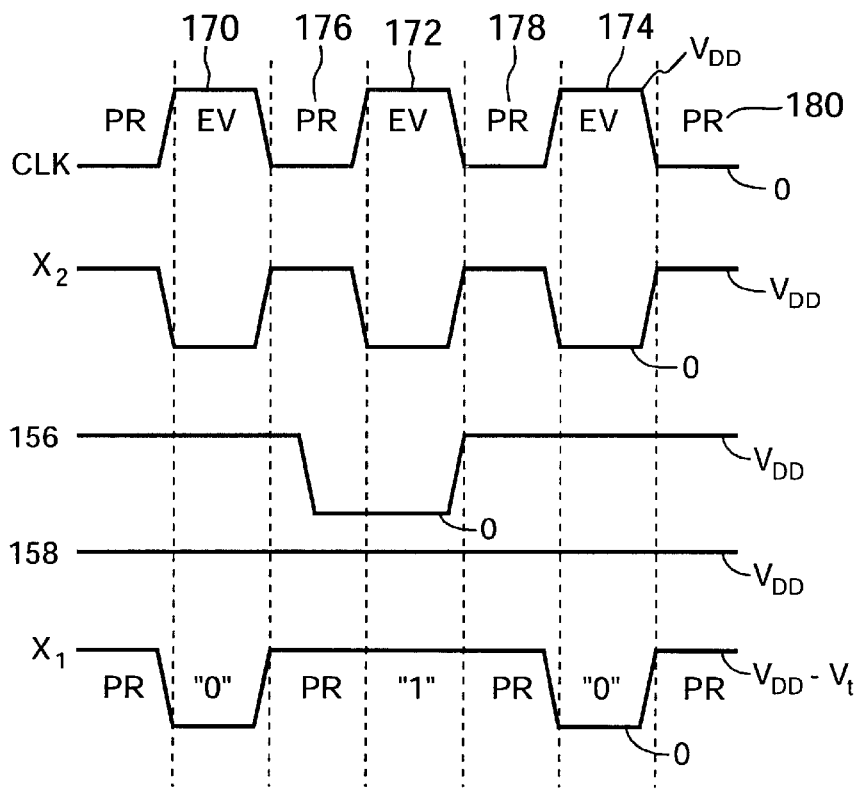
FIGS. 7B and 7D show timing diagrams that illustrate the operation of the resonant NAND gate and resonant NOR gate of FIGS. 7A and 7C, respectively.

A timing diagram is shown in FIG. 7B to illustrate the operation of the NAND circuit. Node X2 oscillates at the resonant frequency which is synchronized to the clock signal 92. When the clock signal 92 is high 170, 172, 174, the evaluation stage is established and the logic path circuitry evaluates the state of the two logic inputs, "a" and "b". If both inputs are high (during 170), then the X1 node is discharged with the discharge current flowing into node X2. If either input, "a" or "b" is low (during 172), then the X1 node is left precharged (and therefore at a logic "1") and the inverting transistor 164 causes the X3 node to be discharged into the X2 node, causing the X3 node to become a logic "0". During the precharge stage of the cycle 176, 178, 180, one of the X1 or X3 nodes is precharged through either the first precharge path 160 or the second precharge path 162.

Figure 7C:
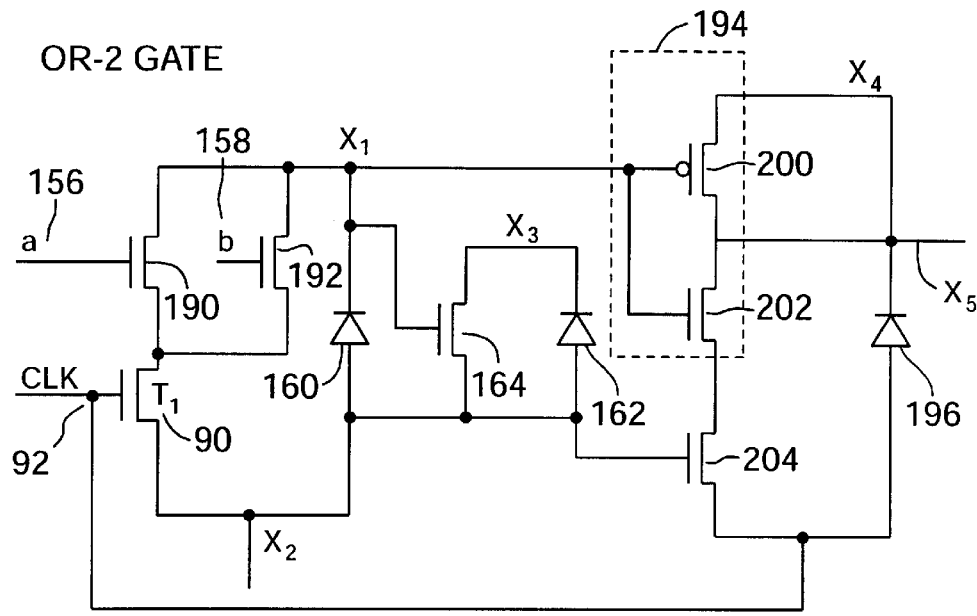

FIG. 7C shows a resonant OR gate in accordance with the present invention. In this circuit, the logic path circuitry has two sections. The first section is configured to form a two-input NOR circuit by connecting two MOS transistors 190, 192 in parallel and between the X1 node and the clock transistor 90 that enables the logic path. The second section is configured to form a logic inverter 194 between the X4 node and the clock line 92.

The first precharge path is implemented with a diode 160 connected between the X1 and X2 nodes and the second precharge path is implemented with a diode 162 connected between the X3 and X2 nodes. An inverting transistor 164 is connected between the X3 and X2 nodes and its gate is connected to the X1 node so that X1 and X3 have complementary logic levels during the evaluation stage.

The second section of the logic path circuitry, the inverter 194, and an additional precharge path 196 are connected in parallel between the X4 node and the clock line. The inverter circuitry 194 includes a PMOS transistor 200 connected in series with an NMOS transistor 202, the gates of each being connected together and to the X1 node and the drains of each being connected together to form the output node X5 of the inverter 194. The source of the PMOS transistor 200 connects to the X4 node and the source of the NMOS transistor 202 connects to the drain of pre-discharge transistor 204, whose source is connected to the clock line 92 and whose gate is connected to node X2. The gates of the inverter 194 connect to the X1 node to receive the output of the NOR circuitry. The pre-discharge transistor 204 is configured to operate such that the transistor is conducting when the clock 92 is low and the X2 node is high (during 216, or 218 of FIG. 7D). The effect of the pre-discharge transistor 204 is to discharge node X5 during the precharge stage. The additional precharge path 196 between the clock line and the X4 node operates to precharge the X4 node when the signal on the clock line 92 is high.

Figure 7D:
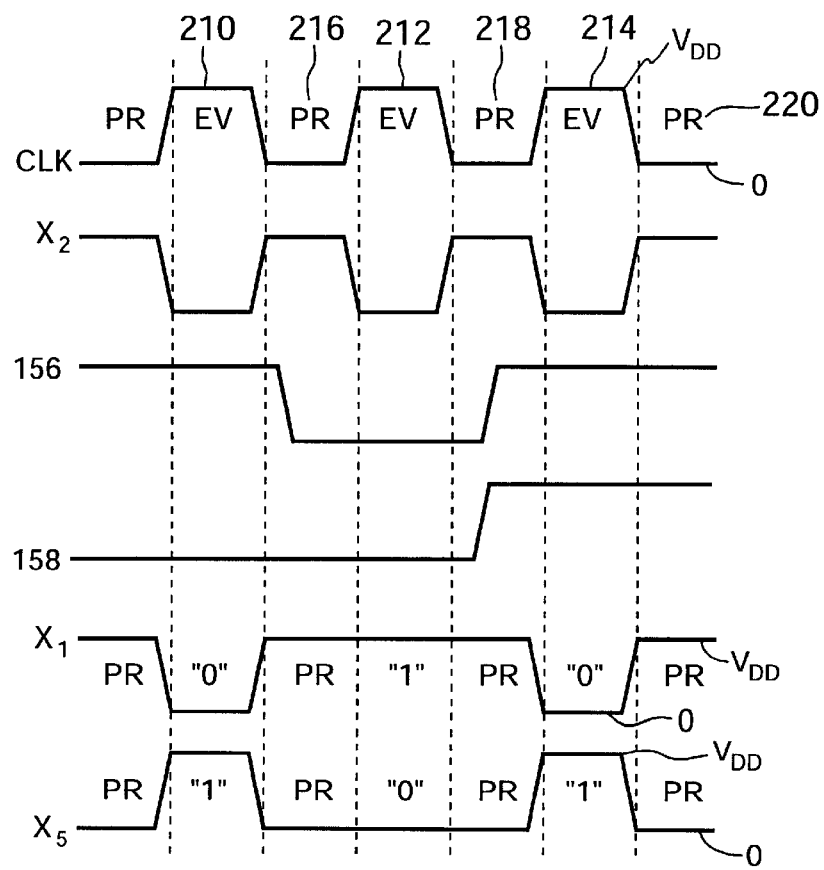

FIG. 7D illustrates the operation of the circuit of FIG. 7C. During the precharge stage 216, 218 of the operation, nodes X1, X3 and X4 are precharged and the output of the inverter X5 is pre-discharged to a voltage near ground because node X1 is precharged and the pre-discharge transistor for the inverter is conducting. During the next phase, the evaluation stage 210, 212, 214, the clock transistor enables the NOR circuitry to change the state of the X1 node depending on the logic state of the inputs 156, 158 to the NOR circuitry. If either one of the logic inputs is high such as during 210 or 214, then node X1 is discharged to the X2 node. If neither input is high such as during 212, then the X3 node is discharged to the X2 node (because transistor 164 is conducting), thus providing approximately the same energy to the energy storage circuitry connected to the X2 node regardless of the state of the logic inputs. A NOR function thus is implemented on the X1 node during the evaluation stage.

Further, during the evaluation stage, if the output of the NOR circuit is high, because node X1 stays precharged, then the output X5 of the inverter 194 remains low. If, however, the output of the NOR circuit is low, because the X1 node is discharged, then the output X5 of the inverter 194 is charged to a high because the PMOS transistor 200 of the inverter 194 connects X5 node to the X4 node which was precharged high during the precharge stage. Operating energy for the inverter circuit is recovered through the clock driver circuitry that is connected (not shown) to the clock line.

Figure 8:
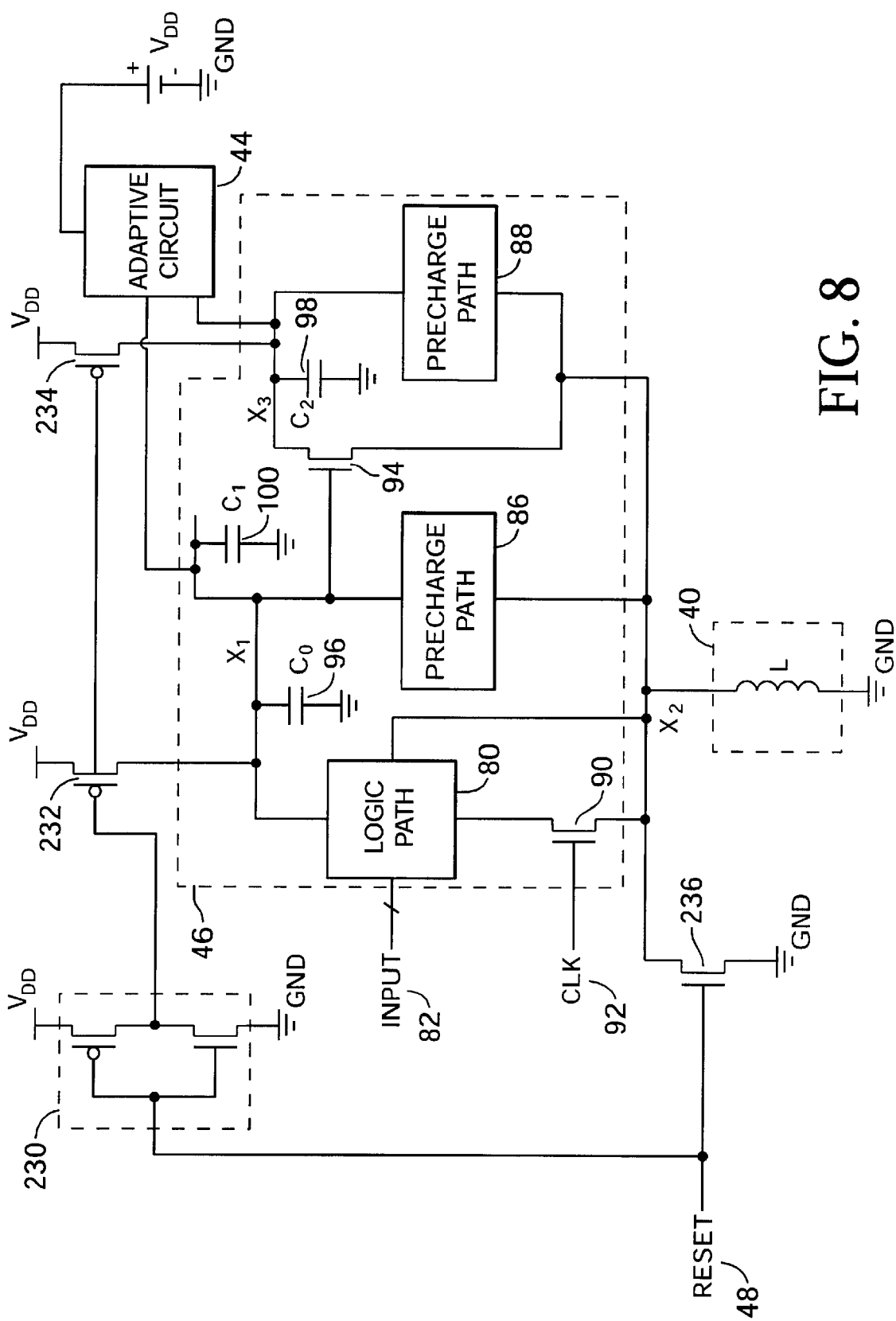
FIG. 8 illustrates an embodiment of the resonant logic circuit together with the initialization circuitry and the energy storage circuitry.

FIG. 8 illustrates an embodiment of the resonant logic circuit 46 together with the initialization circuitry 42, the energy storage circuitry 40 and the adaptive circuitry 44 in accordance with the present invention. In the figure, the logic path 80 and precharge paths 86, 88 are shown as blocks to simplify the illustration. Logic circuitry, such as the NAND or OR circuitry illustrated in FIGS. 7A and 7C, can be substituted into the logic path 80 shown and the precharge circuitry illustrated in FIGS. 7A and 7C can be substituted into the precharge paths 86, 88 shown.

Initialization circuitry 42, as shown in FIG. 2A, comprises inverter 230 connected to the reset line 48, a pair of precharge transistors 232, 234 whose gates are connected to the output of the inverter 230 and a discharge transistor 236 whose gate is connected to the reset line 48. The precharge transistor 232 connects between the supply node VDD of the main power supply and the X1 node to precharge the XI node and the discharge transistor 236 connects between the X2 node and ground to discharge the X2 node to ground.

When the reset line 48 is high, the discharge transistor 236 conducts to discharge node X2. At the same time, the inverter circuit 230 inverts the reset signal 48 and drives the gate of the precharge transistors 232, 234 low causing them to conduct. This precharges the X1 node and the X3 node to a voltage close to the supply node (Vdd−Vt). When the reset line 48 returns low, node X2 begins oscillating at the resonant frequency determined by the load capacitances C0 96, C1 100 and C2 98, the losses in the logic path circuitry and the inductor L 40. Because the load capacitance of the X1 node is made approximately equal to the load capacitance of the X3 node, the frequency of oscillation is very nearly constant regardless of the state of the logic input(s) 82 to the logic circuitry 46.

Adaptive circuitry 44 acts to detect when the precharged nodes are not precharged to a voltage sufficiently close to the main supply voltage. This indicates that more energy needs to be supplied to the logic circuitry because some of the energy has been lost in the form of heat. Upon determining that the precharged voltage has fallen below a predetermined threshold, adaptive circuitry 44 responds by adding energy to the X1 node and the X3 node during the precharge stage of the operating cycle. In this way, the power supply makes up for the dissipative losses in the circuit.

Figure 9:
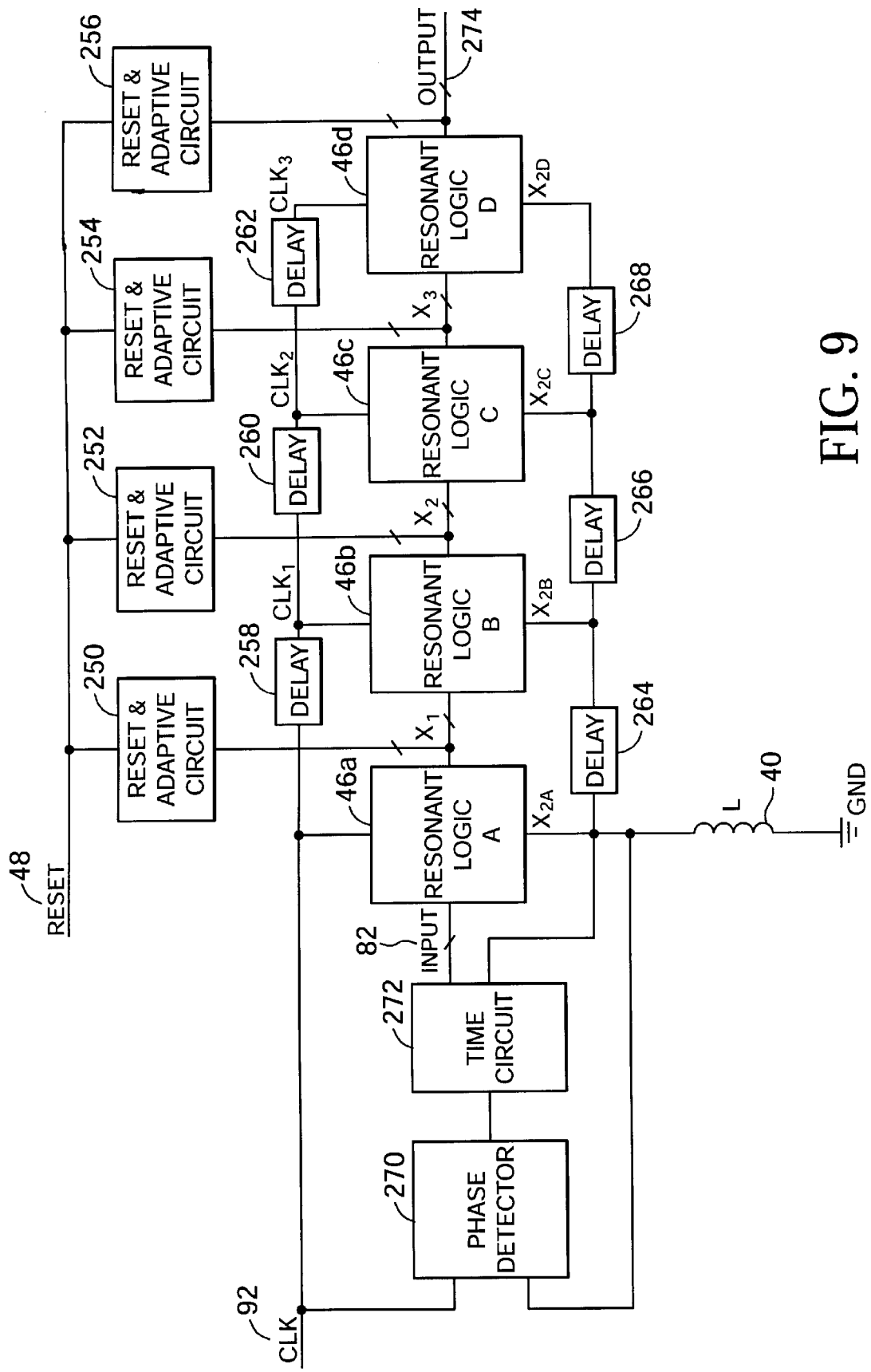
FIG. 9 shows a block diagram of a pipelined logic circuit in accordance with the present invention.

FIG. 9 shows a block diagram of a pipelined logic circuit in accordance with the present invention. Pipelined logic is often times necessary because there is not enough time to evaluate a complex logic function in a single stage of logic circuitry. For example, if the resonant circuitry and the clock of FIG. 9 operate at a frequency of 300 MHz, a logic path has only about 1.6 ns to determine its output. For a simple function, like a NAND or NOR function this may be enough time, but for a complex function like a many-input binary adder circuit there is not enough time to evaluate the logic functions that are be involved. Therefore, the circuitry for the function must be separated into pipelined stages. While the time to compute a logic function result is increased, the pipeline can hold many different logic functions at a time, each in a different stage. This technique not only gives enough time to compute the complex logic function but also increases the throughput of the logic circuitry.

FIG. 9 shows an embodiment of such pipelined circuitry. In the figure, resonant logic stages A 46a, B 46b, C 46c and D 46d are connected together, the output of one stage feeding the input to the next adjacent stage. Each resonant stage connects to an initialization and adaptive circuitry block 252, 254, 256 and each stage, A, B, C, or D, receives a clock signal, CLK, CLK1, CLK2, CLK3 and a oscillating power signal, X2A, X2B, X2C, X2D, respectively. However, stages other than the first stage have their clock signal and oscillating power signal delayed from the clock and oscillating power signal from the previous stage. Each delay 258, 260, 262 in the clock path must match closely each delay, 264, 266, 268, respectively, in the oscillating power signal path, so that the two stay in phase and frequency lock at each stage. Also, a phase detector 270 is included in the pipeline circuitry to determine any phase difference between the clock signal 92 and the resonant signal on the X2A node. The output of the phase detector is fed to a tuning circuit 272 that adjusts the phase of the resonant signal on the X2 node to maintain phase synchronism between the clock and the resonant power signal.

The size of delay, 258, 260, 262, that is inserted between the stages is slightly greater than the time it takes a stage to compute its logic output during the evaluation phase of its power cycle. This way a stable output α1, α2, α3 is available to a succeeding stage when that stage begins its evaluation phase. After n delays, where n is the number of stages, the output 274 from the pipeline is available. In one embodiment, once the output 274 is available from the last stage D of the pipeline, the first stage A can start its precharge phase. In another embodiment, the first stage A starts its precharge phase at the same time the last stage of the pipe line starts to compute its result. This allows the precharge phases of the stages to be overlapped with the evaluation phases so that a new computation can occur every n delays where n is the number of stages.

Although the present invention has been described in considerable detail with reference to certain preferred versions thereof, other versions are possible. Therefore, the spirit and scope of the appended claims should not be limited to the description of the preferred versions contained herein.

What is claimed is:

1. A method of operating logic circuitry with recycled energy, comprising:

while an initialization signal is active, storing energy on a node in the logic circuitry and discharging an energy storage device in response to the active initialization signal; and while the initialization signal is inactive, operating the logic circuitry using the stored energy during a first phase of a clock signal, the logic circuitry determining a logic output based on at least one logic input;

capturing the stored energy during the operation of the logic circuitry in the energy storage device; and returning the captured energy from the energy storage device to the logic circuitry node during a second phase of the clock signal.

2. A method of operating logic circuitry with recycled energy, as recited in claim 1, further comprising the steps of:

while the initialization signal is inactive, comparing a voltage at the energy storage node during the second phase of the clock signal to a predetermined voltage level;

if the voltage at the energy storage node is below the predetermined voltage level, charging the energy storage node during the second phase of the clock until the voltage is above the predetermined voltage level.

3. Logic circuitry operating with recycled energy, comprising:

logic circuitry having an energy storage node, an input clock having a cycle with a first phase and a second phase and an output and at least one logic input, the logic circuitry operating during the first phase of the clock and using energy from the energy storage node to determine the logic output based on the at least one logic input;

an energy storage device connected to the logic circuitry to capture energy used by the logic circuitry during the first phase and to supply the captured energy to the energy storage node during the second phase; and initialization circuitry connected to the energy storage node, the energy storage device and to a reset time, the initialization circuitry configured to initially store energy on the energy storage node of the logic circuitry and to discharge the energy storage device in response to an active reset signal on the reset line.

4. Logic circuitry operating with recycled energy as recited in claim 3, further comprising adaptive circuitry connected to the energy storage node to determine when the captured energy supplied to the storage node during the second phase falls below a predetermined limit and to supply new energy to the energy storage node during the second phase of the clock when the captured energy falls below the limit.

5. Logic circuitry operating with recycled energy as recited in claim 3, wherein the energy storage device is an inductor.

6. Logic circuitry operating with recycled energy as recited in claim 5, wherein the logic circuitry and the inductor form a resonant circuit.

7. Logic circuitry operating with recycled energy as recited in claim 6, wherein the resonant circuit operates at a resonant period equal or nearly equal to the cycle time of the clock input.

8. Logic circuitry operating with recycled energy as recited in claim 3, wherein the logic circuitry includes:

a gated logic path connected between the energy storage node and the energy storage device, the gated logic path configured to determine the logic output based on the at least one logic input during the first phase of the input clock;

a first precharge path connected between the energy storage device and the energy storage node to provide a pathway for the captured energy to return to the energy storage node; logic inverter for inverting the gated logic path output to form an auxiliary energy storage node; and a second precharge path connected between the energy storage device and the auxiliary storage node to provide a pathway for captured energy to return to the auxiliary energy storage node.

9. Logic circuitry operating with recycled energy as recited in claim 8, wherein the first and second precharge paths comprise semiconductor diodes.

10. Logic circuitry operating with recycled energy as recited in claim 8, wherein the logic inverter is an nMOS transistor having its gate connected to the logic path output and its channel connected between the auxiliary energy storage node and the energy storage device.

11. Logic circuitry operating with recycled energy as recited in claim 8, wherein the gated logic path includes:

a logic path; and a MOS clock transistor having a gate that connects to the clock and a channel in series with the logic path so that the logic path is enabled to conduct current between the energy storage node and the energy storage device when the clock transistor is conductive.

12. Logic circuitry operating with recycled energy as recited in claim 11, wherein the logic path comprises a pair of transistors in series to implement a NAND gate.

13. Logic circuitry operating with recycled energy as recited in claim 11, wherein the logic path comprises a pair of transistors in parallel to implement a NOR gate.

14. Logic circuitry operating with recycled energy as recited in claim 3, wherein the initialization circuitry includes:

a MOS discharge transistor having a gate connected to a reset signal and a channel connected across the energy storage device;

an inverter gate connected to the reset line, the inverter gate for generating the complement of the reset signal on an output line;

a first precharge MOS transistor having a gate connected to the inverter output line and having a channel connected between a main power supply node and the energy storage node; and a second precharge MOS transistor having a gate connected to the inverter output line and having a channel connected between the main power supply node and the auxiliary energy node;

wherein, when the reset signal is active, the discharge transistor conducts to discharge the energy storage device, the first precharge transistor conducts to precharge the energy storage node to a voltage approximately equal to a voltage of the main power supply node, and the second precharge transistor conducts to precharge the auxiliary energy storage node to a voltage approximately equal to a voltage of the main power supply node.

15. Pipelined logic circuitry operating with recycled energy, comprising:
  a plurality of logic circuit blocks, each logic circuit block having a logic input, a logic output, a clock input and an energy storage node, wherein the logic input of the first of the logic circuit blocks is connected to a logic input line and the logic output of the last of the logic circuit blocks is connected to a logic output line; and wherein the logic input and logic output of each logic circuit block between the first and last logic circuit blocks is connected to the logic output of the previous adjacent block and logic input of the next adjacent block, respectively, and each logic circuit is connected to a clock line and an energy storage node;
  a plurality of initialization and adaptive control circuit blocks, each connected to the output of one of the logic circuit blocks;
  a first plurality of delay circuits, each connected between the clock lines of adjacent logic circuit blocks to successively delay the clock signal from the first to the last logic block; and
  a second plurality of delay circuits, each connected between the energy storage nodes of adjacent logic circuit blocks to successively delay the storage of energy from the first to the last logic block, the delay circuits of the second plurality having approximately the same delay as the delay circuits of the first plurality;
  wherein, during a first phase of a clock signal on the clock line at each block, each of the plurality of logic blocks generates the results of a logic function on the output of the block based on the logic input of the block and stores energy used during the first phase on the energy storage node of the block, and during a second phase of the clock signal at each block, energy on the energy storage node of the block is returned to the logic block.

16. A method of operating logic circuitry with recycled energy, comprising the steps of:
  while an initialization signal is active, storing energy on a node in the logic circuitry and discharging an energy storage device in response to the active initialization signal; and
  while the initialization signal is inactive,
    operating the logic circuitry using the stored energy during a first phase of a clock signal, the logic circuitry determining a logic output based on at least one logic input;
    capturing the stored energy during the operation of the logic circuitry in the energy storage device;
    returning the captured energy from the energy storage device to the logic circuitry node during a second phase of the clock signal; and
  further comprising, while the initialization signal is inactive,
    comparing a voltage at the energy storage node during the second phase of the clock signal to a predetermined voltage level; and
    if the voltage at the energy storage node is below the predetermined voltage level, charging the energy storage node during the second phase of the clock until the voltage is above the predetermined voltage level.

17. Logic circuitry operating with recycled energy, comprising
  logic circuitry having an energy storage node, an input clock having a cycle with a first phase and a second phase, and an output and at least one logic input, the logic circuitry operating during the first phase of the clock and using energy from the energy storage node to determine the logic output based on the at least one logic input;
  an energy storage device connected to the logic circuitry to capture energy used by the logic circuitry during the first phase and to supply the captured energy to the energy storage node during the second phase;
  initialization circuitry connected to the energy storage node, the energy storage device and to a reset line, the initialization circuitry configured to initially store energy on the energy storage node of the logic circuitry and to discharge the energy storage device in response to an active reset signal on the reset line; and
  adaptive circuitry connected to the energy storage node to determine when the captured energy supplied to the storage node during the second phase falls below a predetermined limit and to supply new energy to the energy storage node during the second phase of the clock when the captured energy falls below the limit.

18. Logic circuitry operating with recycled energy as recited in claim 17, wherein the energy storage device is an inductor.

19. Logic circuitry operating with recycled energy as recited in claim 18, wherein the logic circuitry and the inductor form a resonant circuit.

20. Logic circuitry operating with recycled energy as recited in claim 19, wherein the resonant circuit operates at a resonant period equal or nearly equal to the cycle time of the clock input.

21. Logic circuitry operating with recycled energy, comprising:
  logic circuitry having an energy storage node, an input clock having a cycle with a first phase and a second phase and an output and at least one logic input, the logic circuitry operating during the first phase of the clock and using energy from the energy storage node to determine the logic output based on the at least one logic input;
  an energy storage device connected to the logic circuitry to capture energy used by the logic circuitry during the first phase and to supply the captured energy to the energy storage node during the second phase; and
  initialization circuitry connected to the energy storage node, the energy storage device and to a reset line the initialization circuitry configured to initially store energy on the energy storage node of the logic circuitry and to discharge the energy storage device in response to an active reset signal on the reset line;
  wherein the logic circuitry includes:
    a gated logic path connected between the energy storage node and the energy storage device, the gated logic path configured to determine the logic output based on the at least one logic input during the first phase of the input clock;
    a first precharge path connected between the energy storage device and the energy storage node to provide a pathway for the captured energy to return to the energy storage node;
    a logic inverter for inverting the gated logic path output to form an auxiliary energy storage node; and
    a second precharge path connected between the energy storage device and the auxiliary storage node to provide a pathway for captured energy to return to the auxiliary energy storage node; and
  wherein the first and second precharge paths comprise semiconductor diodes.

22. Logic circuitry operating with recycled energy as recited in claim 21, wherein the gated logic path includes:
   a logic path; and
   a MOS clock transistor having a gate that connects to the clock and a channel in series with the logic path so that the logic path is enabled to conduct current between the energy storage node and the energy storage device when the clock transistor is conductive.

23. Logic circuitry operating with recycled energy as recited in claim 22, wherein the logic path comprises a pair of transistors in series to implement a NAND gate.

24. Logic circuitry operating with recycled energy as recited in claim 22, wherein the logic path comprises a pair of transistors in parallel to implement a NOR gate.

25. Logic circuitry operating with recycled energy, comprising:
   logic circuitry having an energy storage node, an input clock having a cycle with a first phase and a second phase and an output and at least one logic input, the logic circuitry operating during the first phase of the clock and using energy from the energy storage node to determine the logic output based on the at least one logic input;
   an energy storage device connected to the logic circuitry to capture energy used by the logic circuitry during the fist phase and to supply the captured energy to the energy storage node during the second phase; and
   initialization circuitry connected to the energy storage node, the energy storage device and to a reset line, the initialization circuitry configured to initially store energy on the energy storage node of the logic circuitry and to discharge the energy storage device in response to an active reset signal on the reset line;
   wherein the logic circuitry includes:
      a gated logic path connected between the energy storage node and the energy storage device, the gated logic path configured to determine the logic output based on the at least one logic input during the fist phase of the input clock;
      a first precharge path connected between the energy storage device and the energy storage node to provide a pathway for the captured energy to return to the energy storage node;
      a logic inverter for inverting the gated logic path output to form an auxiliary energy storage node; and
      a second precharge path connected between the energy storage device and the auxiliary storage node to provide a pathway for captured energy to return to the auxiliary energy storage node; and
   wherein the logic inverter is an nMOS transistor having its gate connected to the logic path output and its channel connected between the auxiliary energy storage node and the energy storage device.

* * * * *